United States Patent
Matsumoto (10) Patent No.: US 11,146,305 B2
(45) Date of Patent: Oct. 12, 2021

(54) RADIO FREQUENCY MODULE AND COMMUNICATION DEVICE

(71) Applicant: Murata Manufacturing Co., Ltd., Kyoto (JP)

(72) Inventor: Sho Matsumoto, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/091,045

(22) Filed: Nov. 6, 2020

(65) Prior Publication Data

US 2021/0058108 A1 Feb. 25, 2021

Related U.S. Application Data

(63) Continuation of application No. PCT/JP2019/014577, filed on Apr. 2, 2019.

(30) Foreign Application Priority Data

Jun. 26, 2018 (JP) .............................. JP2018-121016

(51) Int. Cl.
*H04L 5/12* (2006.01)
*H04L 23/02* (2006.01)
(Continued)

(52) U.S. Cl.
CPC ............. *H04B 1/44* (2013.01); *H04B 1/0057* (2013.01); *H04B 1/0078* (2013.01); *H04B 1/0483* (2013.01)

(58) Field of Classification Search
CPC ...... H04B 1/44; H04B 1/0057; H04B 1/0078; H04B 1/0483; H04B 1/006; H03H 7/38
(Continued)

(56) References Cited

U.S. PATENT DOCUMENTS

2002/0101907 A1 8/2002 Dent et al.
2014/0073268 A1* 3/2014 Taniuchi ................ H04B 1/525
455/83
(Continued)

FOREIGN PATENT DOCUMENTS

JP 2004519150 A 6/2004
JP 2006340268 A 12/2006
(Continued)

OTHER PUBLICATIONS

International Search Report issued in Application No. PCT/JP2019/014577, dated Jun. 18, 2019.
(Continued)

*Primary Examiner* — Tanmay K Shah
(74) *Attorney, Agent, or Firm* — Pearne & Gordon LLP (57) ABSTRACT

A radio frequency module includes: a switch circuit including a transmit terminal, a receive terminal, a selection terminal, and a common terminal, the switch circuit being capable of switching between (A) a connection between the transmit terminal and the common terminal, (B) connections between the transmit terminal and the common terminal and between the selection terminal and the common terminal, (C) connections between the receive terminal and the common terminal and between the selection terminal and the common terminal, and (D) a connection between the receive terminal and the common terminal; a transmit/receive filter connected to the common terminal and to be used for a time division duplex system, a pass band of the transmit/receive filter being a transmit/receive band of Communication Band A; and a DTC connected to the selection terminal, the DTC changing its capacitance value according to connection switching of the switch circuit.

20 Claims, 7 Drawing Sheets

(51) Int. Cl.
*H04B 1/44* (2006.01)
*H04B 1/00* (2006.01)
*H04B 1/04* (2006.01)

(58) Field of Classification Search
USPC ........................................................ 375/262
See application file for complete search history.

(56) References Cited

U.S. PATENT DOCUMENTS

| | | | |
|---|---|---|---|
| 2016/0134414 A1* | 5/2016 | Pehlke | H04L 5/1469 |
| | | | 370/280 |
| 2018/0041174 A1* | 2/2018 | Muto | H03F 3/195 |
| 2018/0076834 A1 | 3/2018 | Wloczysiak et al. | |
| 2018/0123549 A1* | 5/2018 | Takeuchi | H04B 1/006 |
| 2018/0227006 A1 | 8/2018 | Yasuda | |
| 2019/0013790 A1* | 1/2019 | Ayranci | H03H 7/0161 |

FOREIGN PATENT DOCUMENTS

| | | |
|---|---|---|
| JP | 20170158107 A | 9/2017 |
| JP | 2019/014577 A1 | 6/2019 |
| WO | 2017073509 A1 | 5/2017 |

OTHER PUBLICATIONS

Written Opinion issued in Application No. PCT/JP2019/014577, dated Jun. 18, 2019.

* cited by examiner

FIRST TRANSMIT MODE
A-Tx

FIG. 4B Port T

FIG. 4C Port C

FIG. 5A

RECEIVE MODE A-Rx

FIG. 5B  Port R

FIG. 5C  Port C

RADIO FREQUENCY MODULE AND COMMUNICATION DEVICE

This is a continuation of International Application No. PCT/JP2019/014577 filed on Apr. 2, 2019 which claims priority from Japanese Patent Application No. 2018-121016 filed on Jun. 26, 2018. The contents of these applications are incorporated herein by reference in their entireties.

BACKGROUND OF THE DISCLOSURE

Field of the Disclosure

The present disclosure relates to radio frequency modules and communication devices.

Description of the Related Art

In mobile communication devices such as cellular phones and the like, particularly with development of multi-band systems, it is desirable to transmit and receive a radio frequency signal with less loss in each of a plurality of communication bands.

Japanese Unexamined Patent Application Publication (Translation of PCT Application) No. 2004-519150 (Patent Document 1) discloses an adjustable matching network connected to an antenna and including a T/R switch that switches between a transmit path (T) and a receive path (R), a variable receive matching network connected to a receive contact of the T/R switch, and a variable transmit matching network connected to a transmit contact of the T/R switch. This allows the automatic matching of the impedance of an antenna and the impedance of a filter connected to the variable receive matching network or the variable transmit matching network based on the selection of communication band.

BRIEF SUMMARY OF THE DISCLOSURE

According to the adjustable matching network described in the Patent Document 1, it becomes possible to achieve impedance matching between the antenna and the filter based on the selection between the transmit path and the receive path according to a time division duplex system.

However, the adjustable matching network described in the Patent Document 1 may not be able to adjust the impedance on the input (transmit circuit) side of the filter according to a plurality of transmit modes of the transmit circuit that inputs a radio frequency signal to the filter. That is to say, it is difficult to achieve both the impedance matching between the antenna and the filter in both a transmit state and a receive state and the impedance matching between the transmit circuit and the filter in a plurality of different transmit modes.

The present disclosure is made to resolve the foregoing issue, and an object thereof is to provide a radio frequency module and a communication device, which are capable of performing both an impedance adjustment between the transmit mode and the receive mode and an impedance adjustment between different transmit modes in a transmit/receive path along which the filter is placed, to which a time division duplex system is applied.

In order to achieve the foregoing object, a radio frequency module according to one aspect of the present disclosure includes: a switch circuit including a transmit terminal to which a radio frequency transmit signal is inputted, a receive terminal from which a radio frequency receive signal is outputted, a first selection terminal, and a first common terminal, the switch circuit being capable of switching between (1) a connection between the transmit terminal and the first common terminal, (2) connections between the transmit terminal and the first common terminal and between the first selection terminal and the first common terminal, (3) connections between the receive terminal and the first common terminal and between the first selection terminal and the first common terminal, and (4) a connection between the receive terminal and the first common terminal; a first filter to be used for a time division duplex system, a pass band of the first filter being a transmit/receive band of a first communication band, the first filter being connected to the first common terminal; and a variable impedance element connected to the first selection terminal, the variable impedance element changing an impedance thereof according to connection switching of the switch circuit.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereinafter, an embodiment of the present disclosure will be described in detail with reference to the drawings. Note that an embodiment and modified examples thereof, which will be described below, each illustrate a comprehensive or specific example. Numeric values, shapes, materials, constituting elements, arrangements, and connection modes of the constituting elements, and the like illustrated in the following embodiment and modified examples thereof are mere examples, and not intended to limit the present disclosure. Of constituting elements in the following embodiment and modified examples thereof, the constituting elements that are not described in an independent claim will be described as optional constituting elements. Further, dimensions or ratios of dimensions of constituting elements illustrated in the drawings are not necessarily be precise.

Embodiment

1. Configuration of Communication Device

Figure 1:
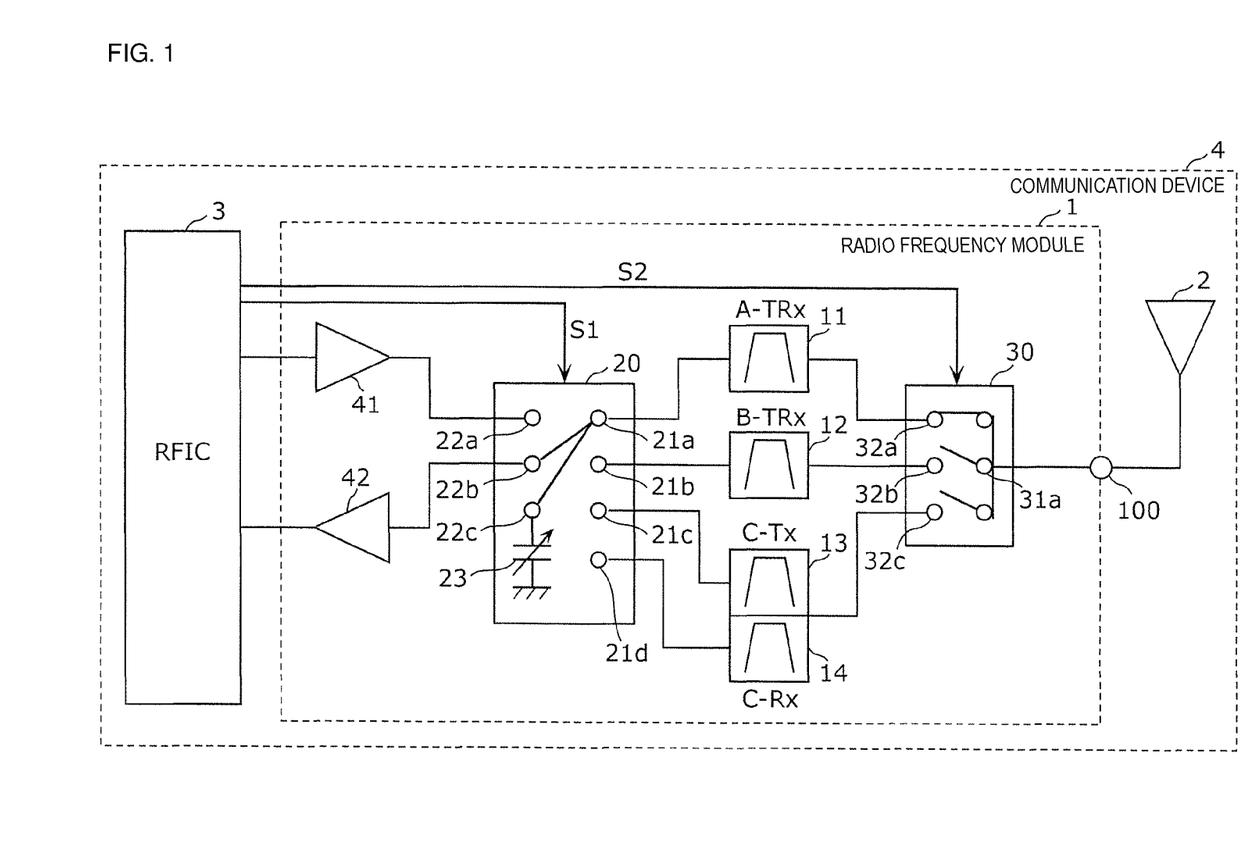
FIG. 1 is a circuit configuration diagram of a communication device according to an embodiment.

FIG. 1 is a circuit configuration diagram of a communication device 4 according to an embodiment. As illustrated in FIG. 1, the communication device 4 includes a radio frequency module 1, an antenna element 2, and an RF signal processing circuit (RFIC) 3.

The RFIC 3 is an RF signal processing circuit that performs processing on radio frequency signals to be transmitted from and received by the antenna element 2. Specifically, the RFIC 3 performs signal processing on an input radio frequency receive signal via a receive path of the radio frequency module 1 using down-converting and the like, and outputs a receive signal generated by this signal processing to a baseband signal processing circuit (not illustrated in the drawing). Furthermore, the RFIC 3 performs signal processing on a transmit signal inputted from the baseband signal processing circuit or the like using up-converting and the like, and outputs a radio frequency transmit signal generated by this signal processing to a transmit path of the radio frequency module 1.

Furthermore, the RFIC 3 also functions as a control unit that controls connection states of switch circuits 20 and 30 included in the radio frequency module 1 on the basis of (1) a selection of communication band and (2) a selection between a transmit mode and a receive mode. Specifically, the RFIC 3 switches the connection state of the switch circuit 20 in response to a control signal S1 and switches the connection state of the switch circuit 30 in response to a control signal S2. The control unit may be provided outside the RFIC 3, or may be provided, for example, in the radio frequency module 1, the baseband signal processing circuit, or the like.

The antenna element 2 is connected to an antenna connection terminal 100 of the radio frequency module 1, emits a radio frequency signal outputted from the radio frequency module 1, and receives a radio frequency signal from outside and outputs to the radio frequency module 1.

Note that, in the communication device 4 according to the present embodiment, the antenna element 2 is not an essential constituting element.

Next, the configuration of the radio frequency module 1 is described in detail.

As illustrated in FIG. 1, the radio frequency module 1 includes the antenna connection terminal 100, the switch circuits 20 and 30, a digital tunable capacitor (DTC) 23, transmit/receive filters 11 and 12, a transmit filter 13, a receive filter 14, a transmit power amplifier 41, and a receive low noise amplifier 42.

The antenna connection terminal 100 is connected to the antenna element 2.

The transmit/receive filter 11 is a first filter whose pass band is a transmit/receive band of Communication Band A and to which a time division duplex (TDD) system corresponding to the connection switching of the switch circuit 20 is applied. The transmit/receive filter 12 is a filter whose pass band is a transmit/receive band of Communication Band B and to which the time division duplex system corresponding to the connection switching of the switch circuit 20 is applied. The transmit filter 13 is a filter whose pass band is a transmit band of Communication Band C. The receive filter 14 is a filter whose pass band is a receive band of Communication Band C. The transmit filter 13 and the receive filter 14 constitute a duplexer that transmits and receives a radio frequency signal of Communication band C using a frequency division duplex (FDD) system.

The transmit power amplifier 41 includes an input terminal and an output terminal and amplifies radio frequency transmit signals of Communication Bands A, B, and C. This input terminal is connected to the RFIC 3.

The receive low noise amplifier 42 includes an input terminal and an output terminal, and amplifies radio frequency receive signals of Communication Bands A, B, and C. This output terminal is connected to the RFIC 3.

The switch circuit 20 includes common terminals 21a, 21b, 21c, and 21d, a transmit terminal 22a, a receive terminal 22b, and a selection terminal 22c. The common terminal 21a (first common terminal) is connected to the transmit/receive filter 11. The common terminal 21b is connected to the transmit/receive filter 12. The common terminal 21c is connected to the transmit filter 13. The common terminal 21d is connected to the receive filter 14. The transmit terminal 22a is connected to the output terminal of the transmit power amplifier 41. The receive terminal 22b is connected to the input terminal of the receive low noise amplifier 42. The selection terminal 22c (first selection terminal) is connected to the DTC 23.

The DTC 23 is connected to a path connecting the selection terminal 22c and ground. The DTC 23 is a capacitor that changes the capacitance value thereof in a stepwise manner according to the connection switching of the switch circuit 20. Note that the switching of the capacitance value of the DTC 23 is performed by the control unit described above.

Note that the DTC 23 may not need to be a variable capacitor and may alternatively be a variable impedance element that changes the impedance thereof according to the connection switching of the switch circuit 20.

Note that by using the DTC 23 as the foregoing variable impedance element, the variable impedance element can be realized by using a small-size element having a plurality of capacitance values. This enables a highly accurate adjustment of impedance of the radio frequency module 1 as well as downsizing of the radio frequency module 1.

A circuit that adjusts impedance may be placed between each common terminal of the switch circuit 20 and the filter. A circuit that adjusts impedance may be placed between the transmit terminal 22a of the switch circuit 20 and the transmit power amplifier 41. A circuit that adjusts impedance may be placed between the receive terminal 22b of the switch circuit 20 and the receive low noise amplifier 42.

The switch circuit 30 includes a common terminal 31a and selection terminals 32a, 32b, and 32c. The common terminal 31a is connected to the antenna connection terminal 100, the selection terminal 32a is connected to the transmit/receive filter 11, the selection terminal 32b is connected to the transmit/receive filter 12, and the selection terminal 32c is connected to the transmit filter 13 and the receive filter 14. This connection configuration allows the switch circuit 30 to switch between (a) a connection between the antenna element 2 and transmit/receive filter 11, (b) a connection between the antenna element 2 and the transmit/receive filter 12, and (c) connections between the antenna element 2 and the transmit filter 13 and between the antenna element 2 and the receive filter 14. Note that the switch circuit 30 is a multi-connection-type switch circuit capable of making two or more connections of the foregoing (a), (b), and (c) simultaneously. That is to say, the radio frequency module 1 according to the present embodiment is not only capable of transmitting and receiving a radio frequency signal of one of Communication Bands A, B, and C, but also capable of simultaneously transmitting, receiving, or transmitting/receiving radio frequency signals of at least two of these three communication bands.

Note that in the foregoing configuration of the radio frequency module 1, as the filter, it is only necessary to include the transmit/receive filter 11 and not necessary to include the transmit/receive filter 12, the transmit filter 13, and the receive filter 14. Furthermore, as a result of this, the common terminals 21b and 21d of the switch circuit 20 and the switch circuit 30 are not essential constituting elements. In this case, the radio frequency module 1 is capable of transmitting, receiving, or transmitting/receiving only a radio frequency signal of Communication Band A. Furthermore, in some case, the transmit power amplifier 41 and the receive low noise amplifier 42 are, for example, incorporated within the RFIC 3 or the like. In this case, the radio frequency module 1 does not need to include the transmit power amplifier 41 and the receive low noise amplifier 42.

In the radio frequency module 1 having the foregoing configuration, the switch circuit 20 switches between (1) the connection between the transmit terminal 22a and the common terminal 21a, (2) the connections between the transmit terminal 22a and the common terminal 21a and between the selection terminal 22c and the common terminal 21a, (3) the connections between the receive terminal 22b and the common terminal 21a and between the selection terminal 22c and the common terminal 21a, and (4) the connection between the receive terminal 22b and the common terminal 21a. That is to say, the switch circuit 20 is a multi-connection-type switch circuit capable of achieving at least the connection states of the foregoing (1) to (4).

The DTC 23 is set to a first capacitance value (first impedance value) in the connection state of the foregoing (2) and set to a second capacitance value (second impedance value) in the connection state of the foregoing (3).

According to the foregoing configuration of the radio frequency module 1 according to the present embodiment, by causing the switch circuit 20 to have the connection state of the foregoing (1) or the connection state of the foregoing (2), the radio frequency module 1 enters into the transmit mode where a radio frequency transmit signal is inputted to the transmit/receive filter 11 via the transmit terminal 22a and the common terminal 21a. Furthermore, by causing the switch circuit 20 to have the connection state of the foregoing (3) or the connection state of the foregoing (4), the radio frequency module 1 enters into the receive mode where a radio frequency receive signal from the transmit/receive filter 11 is outputted from the receive terminal 22b via the common terminal 21a. That is to say, according to the switch circuit 20, it becomes possible to set the radio frequency module 1 to the transmit mode or the receive mode by switching between the connection state of the foregoing (1) or the connection state of the foregoing (2) and the connection state of the foregoing (3) or the connection state of the foregoing (4). At this time, it is conceivable that there may be a case where the impedance of a transmit circuit connected to the transmit terminal 22a looking from the transmit terminal 22a is different from the impedance of a receive circuit connected to the receive terminal 22b looking from the receive terminal 22b. Even in this case, the DTC 23 is connected to the common terminal 21a with the connection state of the foregoing (3), and this enables the impedance matching between the receive circuit of the receive mode and the transmit/receive filter 11 to be in a similar state as the impedance matching between the transmit circuit of the transmit mode and the transmit/receive filter 11.

Furthermore, it is conceivable that the transmit circuit connected to the transmit terminal 22a has, for example, a first transmit mode that emphasizes the efficiency of transmitting power and a second transmit mode that emphasizes the magnitude of transmitting power. In this case, an optimum impedance of the transmit circuit in the first transmit mode is different from an optimum impedance of the transmit circuit in the second transmit mode. Even in this case, in the foregoing (2), it becomes possible to connect the DTC 23 to the common terminal 21a and cause the capacitance value (first capacitance value) of the DTC 23 to be different from the impedance value (second capacitance value) of the DTC 23 in the foregoing (3). This allows to improve both the impedance matching between the transmit circuit in the first transmit mode and the transmit/receive filter 11 and the impedance matching between the transmit circuit in the second transmit mode and the transmit/receive filter 11.

Because of the above, in the radio frequency module 1 in which a transmit/receive path is used for bi-directional communication and the transmit/receive filter 11 to be used for the time division duplex (TDD) system is placed in this transmit/receive path, both the impedance adjustment between the transmit mode and the receive mode and the impedance adjustment between different transmit modes (first transmit mode and second transmit mode) can be performed.

The switch circuit 20 and the DTC 23 may be formed in one chip form. This enables to shorten wiring that connects the DTC 23 and the selection terminal 22c, and thus the impedance of the radio frequency module 1 can be adjusted with a high degree of accuracy by using the variable capacitance of the DTC 23. Furthermore, the radio frequency module 1 can be downsized.

The switch circuit 20, the DTC 23, and the foregoing control unit may constitute a single switch IC. This enables to shorten control wiring that connects the control unit and the switch circuit 20 and control wiring that connects the control unit and the DTC 23, and thus the degradation of control accuracy caused by interference between the control signal and the radio frequency signal can be suppressed. Furthermore, the radio frequency module 1 can be fabricated inexpensively by forming the switch IC using a Si-based complementary metal oxide semiconductor (CMOS).

2. Functions and Effects of Radio Frequency Module

In the following, functions and effects of the radio frequency module 1 according to the present embodiment is described in detail.

Figure 2A:
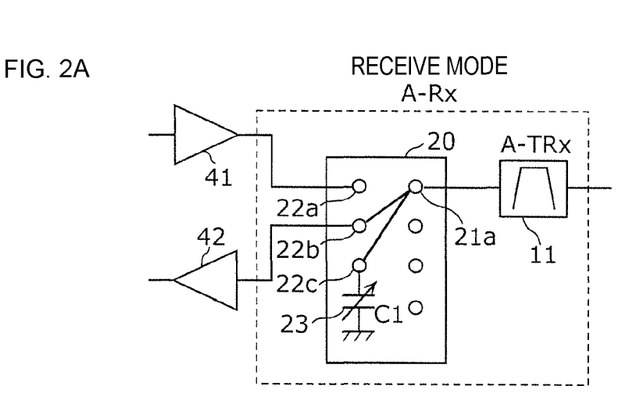
FIG. 2A is a circuit diagram illustrating a connection state of a switch circuit in one mode of a radio frequency module according to an embodiment.
Figure 2B:
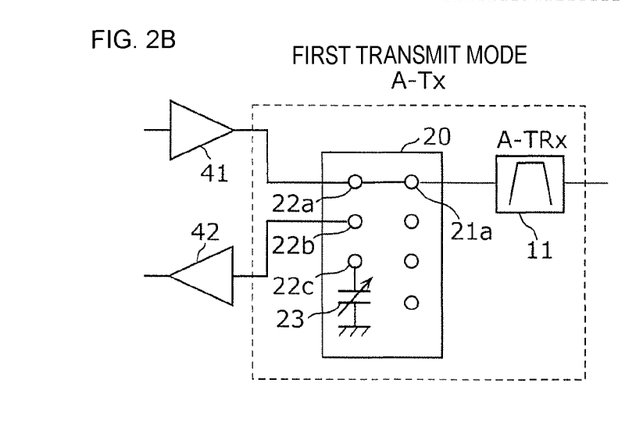
FIG. 2B is a circuit diagram illustrating a connection state of the switch circuit in one mode of the radio frequency module according to the embodiment.
Figure 2C:
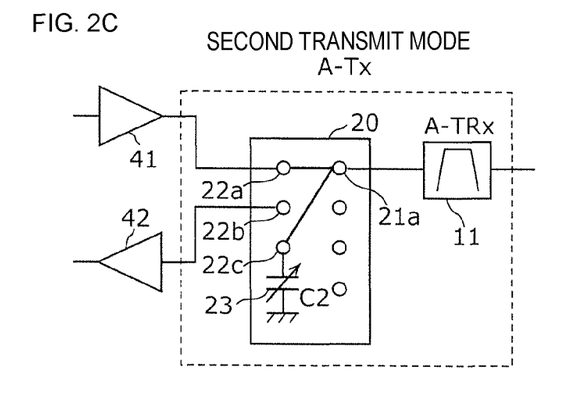
FIG. 2C is a circuit diagram illustrating a connection state of the switch circuit in one mode of the radio frequency module according to the embodiment.

FIG. 2A, FIG. 2B, and FIG. 2C are circuit diagrams illustrating the connection states of the switch circuit 20 in the receive mode, the first transmit mode, and the second transmit mode of the radio frequency module 1 according to the embodiment, respectively. In FIG. 2A, FIG. 2B, and FIG. 2C, of the radio frequency module 1 according to the present embodiment, the connection configuration of the switch circuit 20, the transmit/receive filter 11, the transmit power amplifier 41, and the receive low noise amplifier 42 is disclosed. FIG. 2A illustrates the circuit connection configuration in the receive mode of Communication Band A, FIG. 2B illustrates the circuit connection configuration in the first transmit mode of Communication Band A, and FIG. 2C illustrates the circuit connection configuration in the second transmit mode of Communication Band A.

Note that the receive mode is a mode in which a radio frequency receive signal received by the antenna element 2 propagates through the switch circuit 30, the transmit/receive filter 11, the switch circuit 20, the receive low noise amplifier 42, and the RFIC 3 in this order.

The transmit mode is a mode in which a radio frequency transmit signal outputted from the RFIC 3 propagates through the transmit power amplifier 41, the switch circuit 20, the transmit/receive filter 11, the switch circuit 30, and the antenna element 2 in this order.

Of the transmit mode, the first transmit mode is a transmit mode that gives priority to the power efficiency in the transmit power amplifier 41, and the second transmit mode is a transmit mode that gives priority to the magnitude of power in the transmit power amplifier 41.

As illustrated in FIG. 2A, in the receive mode, the switch circuit 20 is set in such a way that (3) the common terminal 21*a* is connected to the receive terminal 22*b*, the common terminal 21*a* is connected to the selection terminal 22*c*, and the capacitance value of the DTC 23 is set to C1 (second impedance value). In the first transmit mode, the switch circuit 20 is set in such a way that (1) the common terminal 21*a* is connected to the transmit terminal 22*a*. In the second transmit mode, the switch circuit 20 is set in such a way that (2) the common terminal 21*a* is connected to the transmit terminal 22*a*, the common terminal 21*a* is connected to the selection terminal 22*c*, and the capacitance value of the DTC 23 is set to C2 (first impedance value).

To describe the functions and effects produced by the connection configuration of the radio frequency module 1 illustrated in FIG. 2A, FIG. 2B, and FIG. 2C, first, a circuit configuration of a radio frequency module according to a comparative example is described.

Figure 3A:
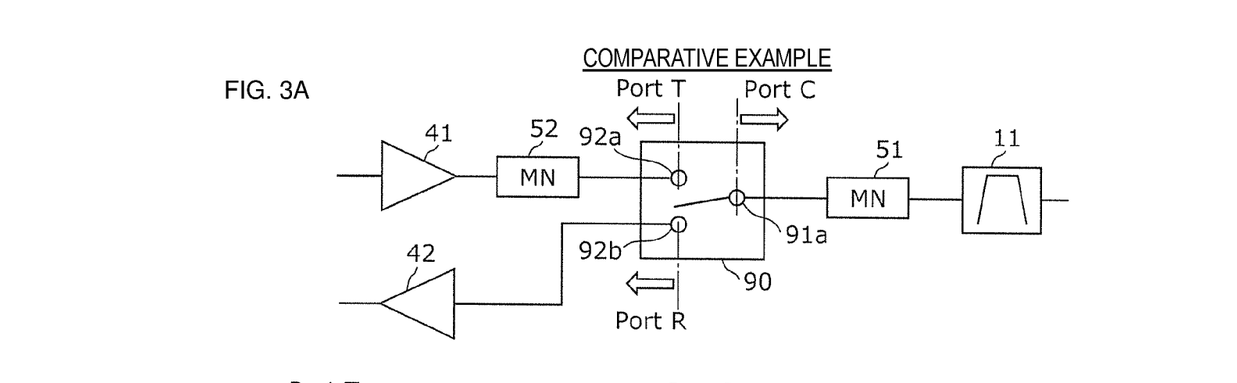
FIG. 3A illustrates a circuit configuration of a radio frequency module according to a comparative example.

FIGS. 3A, 3B, 3C and 3D illustrate a circuit configuration of a radio frequency module according to a comparative example and Smith charts illustrating impedances at respective ports thereof. FIG. 3A illustrates the circuit configuration of the radio frequency module according to the comparative example.

The radio frequency module according to the comparative example includes a switch circuit 90, the transmit/receive filter 11, the transmit power amplifier 41, the receive low noise amplifier 42, and impedance matching circuits 51 and 52. In terms of the circuit configuration, the radio frequency module according to the comparative example is different from the radio frequency module 1 according to the embodiment in that the DTC 23 is not added and the impedance matching circuits 51 and 52 are added.

The switch circuit 90 includes a common terminal 91*a*, a transmit terminal 92*a*, and a receive terminal 92*b*.

Figure 3B:
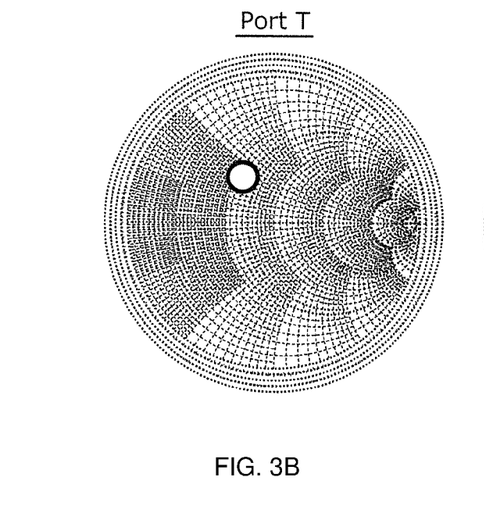
FIGS. 3B, 3C and 3D illustrate Smith charts each illustrating the impedance of a radio frequency module according to a comparative example.
Figure 3C:
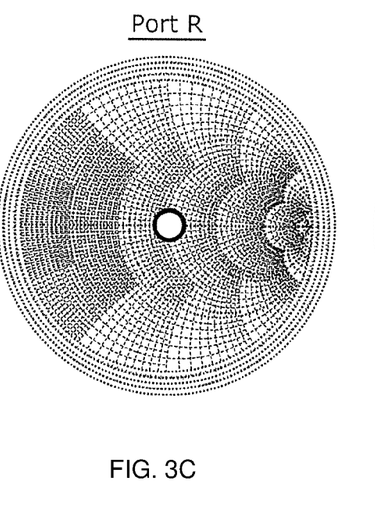
Figure 3D:
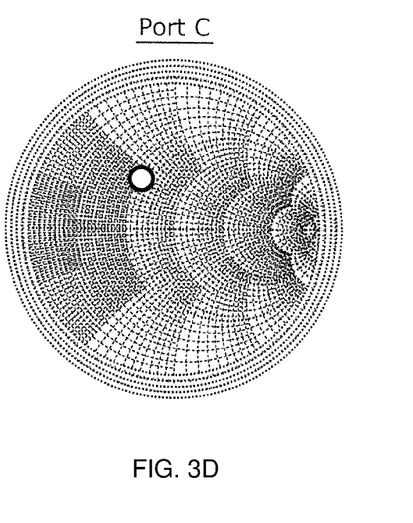

In FIG. 3B, the impedance of the transmit power amplifier 41 in Band A looking from the transmit terminal 92*a* (Port T) of the switch circuit 90 is illustrated. Taking the function of the impedance matching circuit 52 into account, the impedance of the transmit power amplifier 41 in Band A looking from Port T is located, for example, in an inductive low impedance area. FIG. 3D, the impedance of the transmit/receive filter 11 in Band A looking from the common terminal 91*a* (Port C) of the switch circuit 90 is illustrated. Taking the function of the impedance matching circuit 51 into account, the impedance of the transmit/receive filter 11 in Band A looking from Port C is located, for example, in the inductive low impedance area. In FIG. 3C, the impedance of the receive low noise amplifier 42 in Band A looking from the receive terminal 92*b* (Port R) of the switch circuit 90 is illustrated. The impedance of the receive low noise amplifier 42 in Band A looking from Port R is, for example, substantially equal to a reference impedance (for example, 50 Ω).

In the case of the radio frequency module according to the comparative example, in a so-called transmit mode, as illustrated in FIGS. 3B and 3C, the impedance of the transmit power amplifier 41 in Band A looking from Port T has been matched to the impedance of the transmit/receive filter 11 in Band A looking from Port C. However, in a so-called receive mode, as illustrated in FIGS. 3C and 3D, the impedance of the receive low noise amplifier 42 in Band A looking from Port R is not matched to the impedance of the transmit/receive filter 11 in Band A looking from Port C.

That is to say, in the radio frequency module according to the comparative example, the impedance adjustment between the transmit mode and the receive mode has not been performed.

Figure 4A:
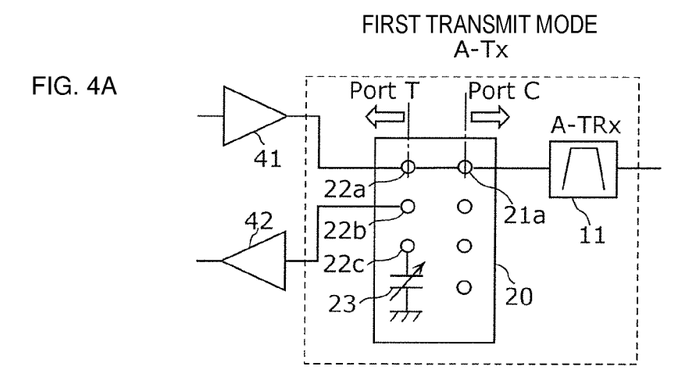
FIG. 4A illustrates a circuit configuration of a radio frequency module according to a first transit mode.
Figure 4B:
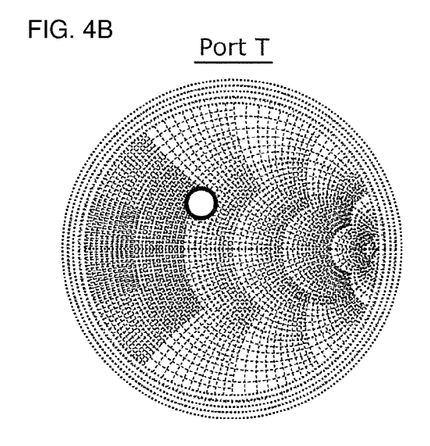
FIGS. 4B and 4C illustrate Smith charts each illustrating the impedance of a radio frequency module according to an embodiment in a first transmit mode.
Figure 4C:
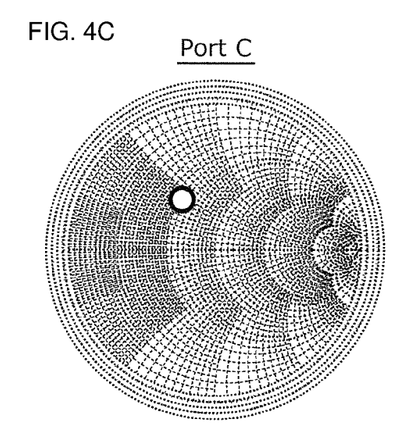

FIGS. 4B and 4C illustrate Smith charts each illustrating the impedance of the radio frequency module 1 according to the embodiment in the first transmit (efficiency) mode. In FIG. 4B, the impedance of the transmit power amplifier 41 in Band A looking from the transmit terminal 22*a* (Port T) of the switch circuit 20 in the first transmit mode is illustrated. The impedance of the transmit power amplifier 41 in Band A looking from Port T is located, for example, in the inductive low impedance area. In FIG. 4C, the impedance of the transmit/receive filter 11 in Band A looking from the common terminal 21*a* (Port C) of the switch circuit 20 in the first transmit mode is illustrated. The impedance of the transmit/receive filter 11 in Band A looking from Port C is located, for example, in the inductive low impedance area.

In the case of the radio frequency module 1 according to the present embodiment, in the first transmit mode, as illustrated in FIGS. 4B and 4C, the impedance of the transmit power amplifier 41 in Band A looking from Port T is matched to the impedance of the transmit/receive filter 11 in Band A looking from Port C. Note that in the first transmit mode, the selection terminal 22*c* is not connected to the common terminal 21*a*. However, in the first transmit mode, the selection terminal 22*c* may alternatively be connected to the common terminal 21*a*. However, in this case, it is only necessary for the DTC 23 in the first transmit mode to have a (independently set) capacitance value different from both the capacitance value C1 of the DTC 23 in the receive mode and the capacitance value C2 of the DTC 23 in the second transmit mode. In order to match the impedance of the transmit power amplifier 41 in Band A looking from Port T and the impedance of the transmit/receive filter 11 in Band A looking from Port C in the first transmit mode, an impedance matching circuit may be placed between the transmit power amplifier 41 and the transmit terminal 22*a*. Alternatively, an impedance matching circuit may be placed between the transmit/receive filter 11 and the common terminal 21*a*.

Figure 5A:
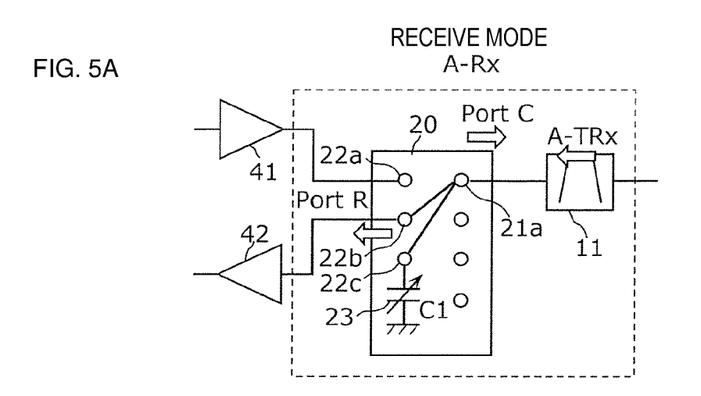
FIG. 5A illustrates a circuit configuration of a radio frequency module according to a receive mode.
Figure 5B:
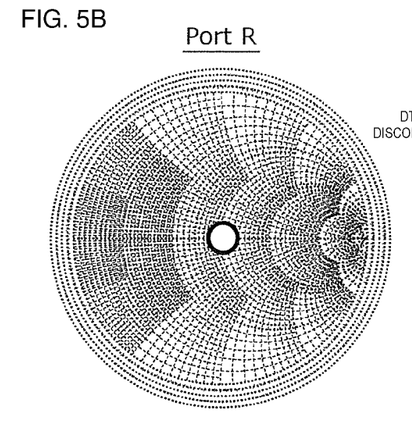
FIGS. 5B and 5C illustrate Smith charts each illustrating the impedance of a radio frequency module according to an embodiment in a receive mode.
Figure 5C:
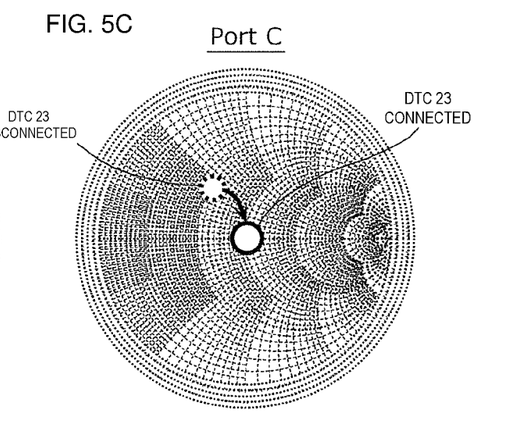

FIGS. 5B and 5C illustrate Smith charts each illustrating the impedance of the radio frequency module 1 according to the embodiment in the receive mode. In FIG. 5B, the impedance of the receive low noise amplifier 42 in Band A looking from the receive terminal 22*b* (Port R) of the switch circuit 20 in the receive mode is illustrated. The impedance of the receive low noise amplifier 42 in Band A looking from Port R is, for example, substantially equal to the reference impedance. In FIG. 5C, the impedance of the transmit/receive filter 11 in Band A looking from the common terminal 21*a* (Port C) of the switch circuit 20 in the receive mode is illustrated. The impedance of the transmit/receive filter 11 in Band A looking from Port C is, for example, substantially equal to the reference impedance.

In the case of the radio frequency module 1 according to the present embodiment, in the receive mode, as illustrated in FIGS. 5B and 5C, the impedance of the receive low noise amplifier 42 in Band A looking from Port R is matched to the impedance of the transmit/receive filter 11 in Band A looking from Port C. The impedance matching in this receive mode is resulted from connecting the common terminal 21*a* to the selection terminal 22*c* and setting the capacitance value of the DTC 23 to C1. As illustrated in FIG. 5C, in the state where the DTC 23 is not connected to the common terminal 21*a*, the impedance of the transmit/receive filter 11 in Band A looking from Port C is located, for example, in the inductive low impedance area, as is the case with the first transmit mode. Whereas, in the state where the DTC 23 is connected to the common terminal 21*a*, a capacitance is connected in parallel to the common terminal 21*a*, and thus the impedance of the transmit/receive filter 11 looking from Port C shifts its phase in a clockwise direction along a circle of constant conductance on an admittance chart. Therefore, by optimizing the capacitance value of the DTC 23 to C1, it becomes possible to position the impedance of the transmit/receive filter 11 in Band A looking from Port C at substantially the reference impedance.

That is to say, in the radio frequency module 1 according to the present embodiment, in the receive mode, by connecting the DTC 23 which is set to the capacitance value C1 in parallel to the common terminal 21*a*, as illustrated in FIGS. 5B and 5C, it becomes possible to achieve matching between the impedance of the transmit power amplifier 41 in Band A looking from Port T and the impedance of the transmit/receive filter 11 in Band A looking from Port C.

Figure 6A:
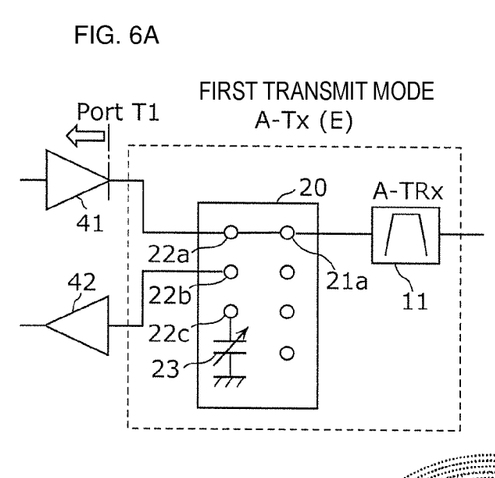
FIG. 6A illustrates a circuit configuration of a radio frequency module according to a first transit mode.
Figure 6B:
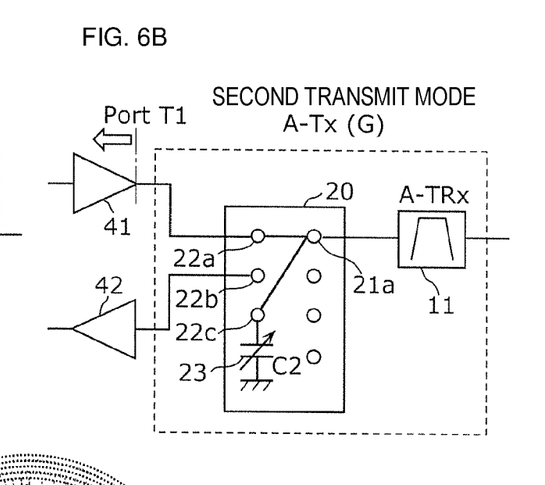
FIG. 6B illustrates a circuit configuration of a radio frequency module according to a second transit mode.
Figure 6C:
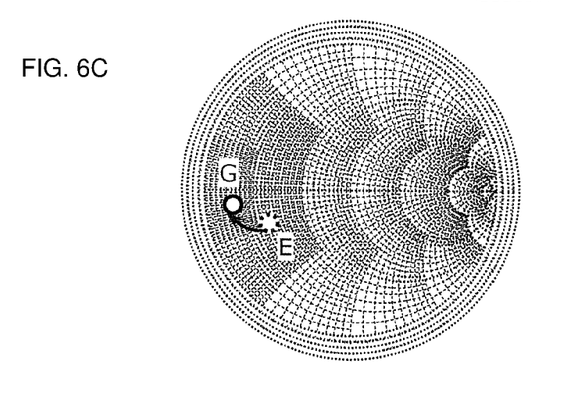
FIG. 6C illustrates a Smith chart illustrating optimum impedances of a radio frequency module according to an embodiment in a first transmit mode and a second transmit mode.

FIG. 6C illustrates a Smith chart illustrating optimum impedances of the radio frequency module 1 according to the embodiment in the first transmit mode and the second transmit mode. FIG. 6C illustrates an optimum point E (impedance that gives priority to power efficiency in Band A) based on an efficiency circle (circle of constant efficiency) of the transmit power amplifier 41 in Band A looking from an output port of the transmit power amplifier 41 in the first transmit (efficiency) mode. Furthermore, FIG. 6C illustrates an optimum point G (impedance that gives priority to output power in Band A) based on a gain circle (circle of constant gain) of the transmit power amplifier 41 in Band A looking from the output port of the transmit power amplifier 41 in the second transmit mode.

In the case of the radio frequency module 1 according to the present embodiment, in the first transmit mode that gives priority to power efficiency, as illustrated in FIGS. 4B and 4C, the impedance of the transmit power amplifier 41 in Band A looking from Port T is matched to the impedance of the transmit/receive filter 11 in Band A looking from Port C. Whereas, the optimum impedance G of the transmit power amplifier 41 in the second transmit mode that gives priority to the magnitude of output power shifts to the lower impedance side, compared with the optimum impedance E of the transmit power amplifier 41 in the first transmit mode that gives priority to power efficiency. Therefore, it becomes possible to achieve impedance matching between the transmit power amplifier 41 and the transmit/receive filter 11 in the second transmit mode by shifting the impedance of the transmit/receive filter 11 in Band A looking from Port C (or Port T1) in the second transmit mode toward the lower impedance side with respect to the impedance of the transmit/receive filter 11 in Band A looing from Port C (or Port T1) in the first transmit mode, in a way similar to the matching of the optimum point E of the efficiency circle to the optimum point G of the gain circle. Here, in the second transmit mode, the DTC 23 is connected to the common terminal 21*a*, and a capacitance is connected in parallel to the common terminal 21*a*. Thus, the impedance of the transmit/receive filter 11 looking from Port C (or Port T1) shifts its phase in a clockwise direction along the circle of constant conductance on an admittance chart. Therefore, by optimizing the capacitance value of the DTC 23 to C2, it becomes possible to shift the impedance of the transmit/receive filter 11 in Band A looking from Port C toward the lower impedance side with respect to the impedance in the first transmit mode.

That is to say, in the radio frequency module 1 according to the present embodiment, in the second transmit mode, by connecting the DTC 23 which is set to the capacitance value C2 in parallel to the common terminal 21*a*, it becomes possible to match the impedance of the transmit power amplifier 41 in Band A looking from Port C (or Port T1) to the impedance of the transmit/receive filter 11 in Band A looking from Port C (or Port T1).

That is to say, in the switch circuit 20 included in the radio frequency module 1 according to the present embodiment, (1) in the case where, of the transmit terminal 22*a*, the receive terminal 22*b*, and the selection terminal 22*c*, only the transmit terminal 22*a* is connected to the common terminal 21*a*, the impedance looking into the transmit/receive filter 11 from the common terminal 21*a* is matched to the optimum impedance of the first transmit mode that gives priority to power efficiency of the transmit power amplifier 41. (2) In the case where, of the transmit terminal 22*a*, the receive terminal 22*b*, and the selection terminal 22*c*, the transmit terminal 22*a* and the selection terminal 22*c* are connected to the common terminal 21*a*, the DTC 23 is set to the first capacitance value C2 (first impedance value), and the impedance looking into the transmit/receive filter 11 from the common terminal 21*a* is matched to the optimum impedance of the second transmit mode that gives priority to the magnitude of output power of the transmit power amplifier 41. (3) In the case where, of the transmit terminal 22*a*, the receive terminal 22*b*, and the selection terminal 22*c*, the receive terminal 22*b* and the selection terminal 22*c* are connected to the common terminal 21*a*, the DTC 23 is set to the capacitance value C1 (second impedance value), and the impedance looking into the transmit/receive filter 11 from the common terminal 21a is matched to the impedance looking into the receive low noise amplifier 42 from the common terminal 21a.

Because of this, in the radio frequency module 1 in which the transmit/receive path is used for bi-directional communication and the transmit/receive filter 11 to be used for the time division duplex (TDD) system is placed in this transmit/receive path, both the impedance adjustment between the transmit mode that the transmit power amplifier 41 has and the receive mode that the receive low noise amplifier 42 has and the impedance adjustment between the first transmit mode and the second transmit mode that the transmit power amplifier 41 has can be performed.

3. Radio Frequency Module According to Modified Example

Figure 7A:
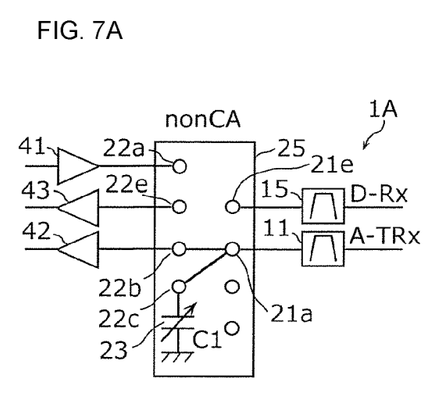
FIG. 7A is a circuit diagram illustrating a connection state of a switch circuit associated with a combination of CA in a radio frequency module according to a modified example of an embodiment.
Figure 7B:
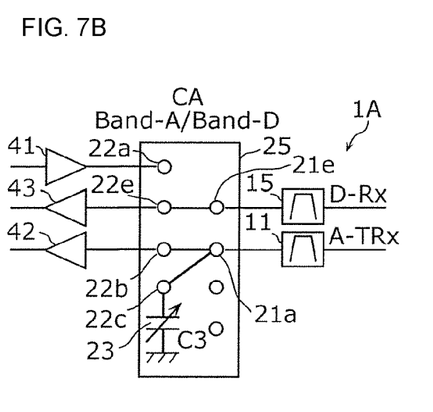
FIG. 7B is a circuit diagram illustrating a connection state of the switch circuit associated with a combination of CA in the radio frequency module according to the modified example of the embodiment.

A radio frequency module 1A according to the present modified example has the configuration in which impedance matching in carrier aggregation (CA) is added to the configuration of the radio frequency module 1 according to the embodiment described above.

FIG. 7A and FIG. 7B are circuit diagrams illustrating connection states of a switch circuit associated with a combination of CA in the radio frequency module 1A according to the modified example of the embodiment.

The radio frequency module 1A according to the present modified example is different from the radio frequency module 1 according to the embodiment in that a receive filter 15 whose pass band is a receive band of Communication Band D, a receive low noise amplifier 43, a common terminal 21e, and a receive terminal 22e are further included. In the following, the radio frequency module 1A according to the present modified example is described with the emphasis on points different from the radio frequency module 1 according to the embodiment while omitting the description regarding the same points. Note that FIG. 7A and FIG. 7B illustrate only essential constituting elements included in the radio frequency module 1A according to the present modified example. However, the radio frequency module 1A according to the present modified example may further include the antenna connection terminal 100, the switch circuit 30, the transmit/receive filter 12, the transmit filter 13, and the receive filter 14, which are included in the radio frequency module 1 according to the embodiment.

The receive filter 15 is a second filter whose pass band is a receive band of Communication Band D (second communication band).

The receive low noise amplifier 43 includes an input terminal and an output terminal and amplifies a radio frequency receive signal of Communication Band D. This output terminal is connected to the RFIC 3.

The switch circuit 25 includes, in addition to all the terminals included in the switch circuit 20 according to the embodiment, the common terminal 21e and the receive terminal 22e. The common terminal 21e (second common terminal) is connected to the receive filter 15. The receive terminal 22e (second selection terminal) is connected to the input terminal of the receive low noise amplifier 43.

The DTC 23 is connected to a path connecting the selection terminal 22c and the ground. The DTC 23 is a capacitor that changes the capacitance value thereof in a stepwise manner according to the connection switching of the switch circuit 25.

The switch circuit 25 is capable of making one of (1) a first connection that is the connection between the receive terminal 22b and the common terminal 21a and (2) a second connection that is the connection between the receive terminal 22e and the common terminal 21e and making these two connections simultaneously. That is to say, the radio frequency module 1A is capable of performing non-CA of Communication Band A and CA of Communication Bands A and D according to the connection switching of switch circuit 25.

Here, as illustrated in FIG. 7A, in the case of performing non-CA of Communication Band A, by making the foregoing (1) and connecting the selection terminal 22c to the common terminal 21a, the DTC 23 that is set to the capacitance value C1 is connected to the common terminal 21a. Furthermore, as illustrated in FIG. 7B, in the case of performing CA of Communication Band A and Communication Band D, by simultaneously making the foregoing (1) and the foregoing (3) and connecting the selection terminal 22c to the common terminal 21a, the DTC 23 that is set to the capacitance value C3 is connected to the common terminal 21a. Note that in the foregoing CA of Communication Band A and Communication Band D, the DTC 23 may alternatively be connected to the common terminal 21e, instead of the common terminal 21a.

That is to say, the capacitance value C1 of the DTC 23 in the first connection is different from the capacitance value C3 of the DTC 23 in the first connection and the second connection.

This enables to change the capacitance value of the DTC 23 for non-CA and CA, and thus even at the time of performing CA, a composite impedance of a filter for CA looking from a common terminal can be matched to the impedance of the receive low noise amplifier looking from the common terminal. Accordingly, in the radio frequency module 1A in which the transmit/receive path is used for bi-directional communication and the transmit/receive filter 11 to be used for the time division duplex (TDD) system is placed in this transmit/receive path, both the impedance adjustment between the transmit mode and the receive mode and the impedance adjustment between different transmit modes (first transmit mode and second transmit mode) can be performed, and furthermore, by using the variable capacitance of the DTC 23 which is used for these impedance adjustments, the impedance matching at the time of CA can be achieved.

Note that the receive filter 15 may alternatively be a transmit/receive filter to be used for a TDD system.

In the present modified example, the configuration that performs CA in a receive system is illustrated as an example. However, a radio frequency module having a configuration that performs CA in a transmit system or a configuration that performs CA in both the transmit system and the receive system is also included in the radio frequency modules according to the present disclosure. For example, as the configuration that performs CA in a transmit system, instead of the receive filter 15 and the receive low noise amplifier 43 in the radio frequency module 1A according to the present modified example, a transmit filter and a transmit power amplifier may be placed, respectively.

Other Embodiments

The radio frequency module and the communication device according to the present disclosure are described using the embodiment and the modified example thereof. However, the present disclosure is not limited to the foregoing embodiment and modified example thereof. Other embodiments realized by combining arbitrary constituting elements of the foregoing embodiment and the modified example thereof, modified examples obtained by applying various modifications apparent to those skilled in the art to the foregoing embodiment and the modified example thereof without departing the scope of the present disclosure, and various devices including the foregoing radio frequency module and the foregoing communication device may also be included in the present disclosure.

For example, in the radio frequency modules and the communication devices according to the embodiment and the modified example, a matching element such as an inductor, a capacitor, or the like, or a switch circuit may be connected between the constituting elements. Note that the inductor may include a wiring inductor formed of wiring connecting the constituting elements.

The present disclosure can be widely used in communication equipment such as cellular phones and the like as a radio frequency module and a communication device each including a transmit/receive filter, to which a TDD system is applied.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio frequency module comprising:
   a switch circuit including a transmit terminal to which a radio frequency transmit signal is inputted, a receive terminal from which a radio frequency receive signal is outputted, a first selection terminal, and a first common terminal, the switch circuit being configured to switch between (1) a connection between the transmit terminal and the first common terminal, (2) connections between the transmit terminal and the first common terminal and between the first selection terminal and the first common terminal, (3) connections between the receive terminal and the first common terminal and between the first selection terminal and the first common terminal, and (4) a connection between the receive terminal and the first common terminal;
   a first filter configured to be used for a time division duplex system, a pass band of the first filter being a transmit/receive band of a first communication band, the first filter being connected to the first common terminal; and
   a variable impedance element connected to the first selection terminal, the variable impedance element changing an impedance thereof according to connection switching of the switch circuit.

2. The radio frequency module according to claim 1, wherein the switch circuit and the variable impedance element are formed in one chip form.

3. The radio frequency module according to claim 1, wherein the variable impedance element is a digital tunable capacitor (DTC).

4. The radio frequency module according to claim 2, wherein the variable impedance element is a digital tunable capacitor (DTC).

5. The radio frequency module according to claim 1, further comprising:
   a transmit power amplifier including an input terminal and an output terminal, the output terminal being connected to the transmit terminal, the transmit power amplifier operating in one of a first transmit mode and a second transmit mode, the first transmit mode giving priority to power efficiency, the second transmit mode giving priority to magnitude of output power; and
   a receive low noise amplifier including an input terminal and an output terminal, the input terminal being connected to the receive terminal.

6. The radio frequency module according to claim 2, further comprising:
   a transmit power amplifier including an input terminal and an output terminal, the output terminal being connected to the transmit terminal, the transmit power amplifier operating in one of a first transmit mode and a second transmit mode, the first transmit mode giving priority to power efficiency, the second transmit mode giving priority to magnitude of output power; and
   a receive low noise amplifier including an input terminal and an output terminal, the input terminal being connected to the receive terminal.

7. The radio frequency module according to claim 3, further comprising:
   a transmit power amplifier including an input terminal and an output terminal, the output terminal being connected to the transmit terminal, the transmit power amplifier operating in one of a first transmit mode and a second transmit mode, the first transmit mode giving priority to power efficiency, the second transmit mode giving priority to magnitude of output power; and
   a receive low noise amplifier including an input terminal and an output terminal, the input terminal being connected to the receive terminal.

8. The radio frequency module according to claim 5, wherein in the switch circuit,
   (1) when the transmit terminal is connected to the first common terminal, an impedance looking into the first filter from the first common terminal is matched to an optimum impedance of the first transmit mode,
   (2) when the transmit terminal and the first selection terminal are connected to the first common terminal, the variable impedance element is set to a first impedance value, and the impedance looking into the first filter from the first common terminal is matched to an impedance of the second transmit mode, and
   (3) when the receive terminal and the first selection terminal are connected to the first common terminal, the variable impedance element is set to a second impedance value, and the impedance looking into the first filter from the first common terminal is matched to an impedance looking into the receive low noise amplifier from the first common terminal.

9. The radio frequency module according to claim 8, further comprising:
   a second filter, wherein
   the switch circuit further includes a second common terminal and a second selection terminal, the second selection terminal inputting or outputting a radio frequency signal of a second communication band,
   the second filter is connected to the second common terminal and has a pass band that corresponds to the second communication band, and
   in the switch circuit,
   the variable impedance element is set to a third impedance value when a connection between the second common terminal and the second selection terminal is made at a same time as one of (1) the connection between the transmit terminal and the first common terminal, (2) the connections between the transmit terminal and the first common terminal and between the first selection terminal and the first common terminal, or (3) the connections between the receive terminal and the first common terminal and between the first selection terminal and the first common terminal.

10. A communication device comprising:
an RF signal processing circuit that performs processing on a radio frequency signal being transmitted or received by an antenna element;
a control unit that controls connection of the switch circuit; and
the radio frequency module according to claim 1 that transmits the radio frequency signal between the antenna element and the RF signal processing circuit.

11. A communication device comprising:
an RF signal processing circuit that performs processing on a radio frequency signal being transmitted or received by an antenna element;
a control unit that controls connection of the switch circuit; and
the radio frequency module according to claim 2 that transmits the radio frequency signal between the antenna element and the RF signal processing circuit.

12. A communication device comprising:
an RF signal processing circuit that performs processing on a radio frequency signal being transmitted or received by an antenna element;
a control unit that controls connection of the switch circuit; and
the radio frequency module according to claim 3 that transmits the radio frequency signal between the antenna element and the RF signal processing circuit.

13. A communication device comprising:
an RF signal processing circuit that performs processing on a radio frequency signal being transmitted or received by an antenna element;
a control unit that controls connection of the switch circuit; and
the radio frequency module according to claim 5 that transmits the radio frequency signal between the antenna element and the RF signal processing circuit.

14. A communication device comprising:
an RF signal processing circuit that performs processing on a radio frequency signal being transmitted or received by an antenna element;
a control unit that controls connection of the switch circuit; and
the radio frequency module according to claim 8 that transmits the radio frequency signal between the antenna element and the RF signal processing circuit.

15. A communication device comprising:
an RF signal processing circuit that performs processing on a radio frequency signal being transmitted or received by an antenna element;
a control unit that controls connection of the switch circuit; and
the radio frequency module according to claim 9 that transmits the radio frequency signal between the antenna element and the RF signal processing circuit.

16. The radio frequency module according to claim 1, wherein the variable impedance element is connected in parallel to the first common terminal.

17. The radio frequency module according to claim 9, wherein the variable impedance element is connected to a path connecting the first selection terminal and ground.

18. The radio frequency module according to claim 9, wherein the variable impedance element is a digital tunable capacitor (DTC).

19. The radio frequency module according to claim 10, further comprising a second switch circuit.

20. The radio frequency module according to claim 19, wherein the control unit controls connection states of the second switch circuit.

* * * * *